(12) United States Patent
Chapman

(10) Patent No.: US 7,050,237 B2
(45) Date of Patent: May 23, 2006

(54) HIGH-EFFICIENCY SPECTRAL PURITY FILTER FOR EUV LITHOGRAPHY

(75) Inventor: Henry N. Chapman, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/862,127

(22) Filed: Jun. 2, 2004

(65) Prior Publication Data

US 2006/0087738 A1    Apr. 27, 2006

(51) Int. Cl.
*G02B 5/18* (2006.01)

(52) U.S. Cl. .................. 359/574; 359/572; 359/576; 359/359; 359/361

(58) Field of Classification Search .............. 359/574, 359/558, 566, 569, 572, 576, 359, 361
See application file for complete search history.

(56) References Cited

U.S. PATENT DOCUMENTS

| | | | |
|---|---|---|---|
| 5,729,365 A | 3/1998 | Sweatt | ......................... 359/2 |
| 5,843,321 A | 12/1998 | Kamihara et al. | ............ 216/26 |
| 6,469,827 B1 | 10/2002 | Sweatt et al. | ............... 359/351 |
| 6,576,912 B1 | 6/2003 | Visser et al. | ............. 250/492.2 |
| 2002/0097385 A1 | 7/2002 | Van Elp et al. | ............... 355/67 |
| 2002/0186811 A1 | 12/2002 | Weiss et al. | .................. 378/34 |

FOREIGN PATENT DOCUMENTS

| | | | | |
|---|---|---|---|---|
| EP | 1197803 | | 4/2002 | |
| JP | 06-027297 | * | 2/1994 | ................. 378/34 |

* cited by examiner

*Primary Examiner*—Fayez G. Assaf
(74) *Attorney, Agent, or Firm*—John P. Wooldridge; Alan H. Thompson

(57) ABSTRACT

An asymmetric-cut multilayer diffracts EUV light. A multilayer cut at an angle has the same properties as a blazed grating, and has been demonstrated to have near-perfect performance. Instead of having to nano-fabricate a grating structure with imperfections no greater than several tens of nanometers, a thick multilayer is grown on a substrate and then cut at an inclined angle using coarse and inexpensive methods. Effective grating periods can be produced this way that are 10 to 100 times smaller than those produced today, and the diffraction efficiency of these asymmetric multilayers is higher than conventional gratings. Besides their ease of manufacture, the use of an asymmetric multilayer as a spectral purity filter does not require that the design of an EUV optical system be modified in any way, unlike the proposed use of blazed gratings for such systems.

12 Claims, 5 Drawing Sheets

HIGH-EFFICIENCY SPECTRAL PURITY FILTER FOR EUV LITHOGRAPHY

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to extreme ultraviolet lithography (EUVL) systems, and more specifically, it relates to techniques for protecting the optical elements of a EUVL system as well as a wafer in such a system from unwanted out-of-band radiation.

2. Description of Related Art

A spectral purity filter is required in the illuminator of an EUV lithographic system in order to prevent high-power out-of-band radiation from heating up elements in the optical train and to prevent this same radiation from exposing the wafer. The use of an absorbing filter cannot scale to high-power sources due to the thermal load on the foil. It has previously been proposed to use a multilayer-coated blazed diffraction grating to diffract desired EUV light into the optical system (and thereby deflecting the unwanted out-of-band radiation out of the system).

Extreme ultraviolet (EUV) optical systems are being developed for the 11–14 nm wavelength range for applications in semiconductor lithography. An EUV lithographic tool consists of an EUV source, an illuminator optical system (also known as a condenser), a patterned mask, and a projection imaging system. The projection imaging system forms an image of the mask on a resist-coated wafer. The entire optical system consists of reflective surfaces. Most surfaces in the illuminator (and all in the projection optics) are multilayer coated to allow reflection to occur. In order to receive enough power at the wafer to print patterns at a rate that is economically viable, up to 100 Watts of in-band EUV light is required to be collected by the illuminator, due to the fact that multilayer mirrors have reflectivities of less than 72%, and there may be up to 10 or more multilayer surfaces in the system. The EUV source produces a continuous spectrum of light from the infrared to energies higher than the desired EUV light The out-of-band radiation may account for more than 90% of the total integrated power of the source. This power will cause heating of the mirrors, which could degrade their shape, and hence degrade the imaging performance of the system. In addition, the out of band radiation could expose the wafer. Therefore, this power must be prevented from passing through the system.

In the DUV to EUV wavelength range, the multilayer coatings will efficiently absorb all light except that within the bandpass of the coating. This will cause the first multilayer-coated optic in the optical train to heat up, but this power will not be transmitted to subsequent optics. However, visible and IR light is partially reflected by both grazing-incidence and multilayer-coated optics, and so all optics in the optical train will absorb power in this range. In order to prevent distortion of the optical surfaces, substantial cooling is required on the optics, and a spectral purity filter is required that ideally allows only in-band radiation to pass through to subsequent optics.

The spectral purity filter used in experimental EUV lithography systems to date (see, for example, H. N. Chapman et al J. Vac. Sci. Tech. B 19, 2389–2395 (2001).) is a thin foil that is opaque to visible and IR light, and which transmits a broad band in the EUV. Typically these foils are made of silicon, beryllium, zirconium, or other suitable transmitting material. Unfortunately, for these foils to be robust enough to absorb the out of band power, they must be thick (which limits their transmission of in-band EUV to about 50%). The foil can become overheated and damaged. An improved idea (Sweatt, Tichenor and Bernandez, U.S. Pat. No. 6,469,827B1) is to use a grating as a spectral purity filter. The grating is oriented so that the desired in-band EUV light is diffracted into the optical system. Shorter wavelength light will be diffracted by smaller angles and will not be directed onto subsequent optics of the system. Similarly, longer wavelength light will be diffracted by larger angles. Wavelengths, such as IR, greater than the period of the grating will be specularly reflected (in this case the grating acts as a mirror). Specularly reflected light also will not be directed into the optical system, which only receives light that diffracts at a particular range of angles. The grating would be blazed to maximize diffraction efficiency in the desired EUV wavelength. The blaze condition is that the diffracted wavelength reflects specularly from the inclined facets of the grating. The use of a grating has two advantages: the grating can be formed directly on an optical surface of the illuminator, thus avoiding throughput losses from an extra element such as the thin foil; and the out of band power is directed out of the system and is not absorbed in the filter itself as is the case for the foil filter.

The proposal for the grating spectral purity filter of Sweatt, Tichenor and Bernandez is to write a blazed grating onto one of the optical surfaces of the illuminator, which is then overcoated with a multilayer coating. A disadvantage of the proposed technique is that it is difficult to manufacture gratings onto the curved mirror substrates. The most efficient blazed gratings to date have been made by multiple-level electron-beam lithography, which is slow and expensive (Naulleau, U.S. Pat. No. 6,392,792 B1). More conventional holographic and ruled blazed gratings could be manufactured on curved optics, but at significant cost and reduced efficiency. All types of multilayer-coated gratings do suffer inefficiencies due multiple diffracted orders, which are caused by deviations from the ideal saw-tooth shape of the facets and the smoothing action of the multilayer coating. Another disadvantage of the proposed technique is that the optical surface containing the grating has to be redesigned so that specular light is tilted out of the system, and the diffracted light is directed into the system. This requires the element to be tilted, which can lead to aberrations.

SUMMARY OF THE INVENTION

It is an object of the present invention to provide a method for providing a highly efficient diffractive spectral purity filter for EUV lithography.

It is another object to provide a simple and inexpensive way to manufacture a highly efficient diffractive spectral purity filter for EUV lithography onto a multilayer-coated optical element.

These and other objects will be apparent to those skilled in the art based on the disclosure herein.

A high-efficiency diffractive spectral-purity filter is disclosed, which can be used in EUV lithography to direct only the desired in-band radiation through the optical system. The high-power out-of-band radiation must be prevented from exposing the light-sensitive wafer and from heating up and deforming the mirror surfaces in the optical train. The method disclosed here involves polishing a thick multilayer (ideally consisting of many thousands of periods) at an angle to act as a perfect blazed grating. The multilayer is first deposited on one of the mirror substrates of the illuminator. The multilayer is then cut at a shallow angle (either by mechanical or ion-beam polishing). The asymmetric-cut multilayer acts as a perfect blazed grating, with only one diffracted order. The desired in-band EUV light, which is diffracted by the multilayer, reflects specularly from the layers of the multilayer. Out-of-band EUV light is absorbed in the multilayer. Out-of-band UV, visible and IR light reflects specularly from the inclined surface of the cut multilayer and is hence redirected out of the optical system. The method is superior to the use of absorbing foils as a filter, which cannot scale to high power sources, and to the use of multilayer-coated blazed gratings, which require the optical system to be re-optimized, are difficult and expensive to manufacture, and are less efficient. The method of manufacture proposed here could also be used to make large-area high-efficiency gratings for x-ray and EUV astronomy and for x-ray source diagnostics (spectroscopy), and for x-ray free-electron laser pulse compression. Accordingly, the invention has a variety of uses, including EUV and x-ray imaging, EUV and soft-x-ray astronomy, EUV and soft-x-ray microscopy, EUV and soft-x-ray spectroscopy and soft-x-ray pulse compression.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1A:
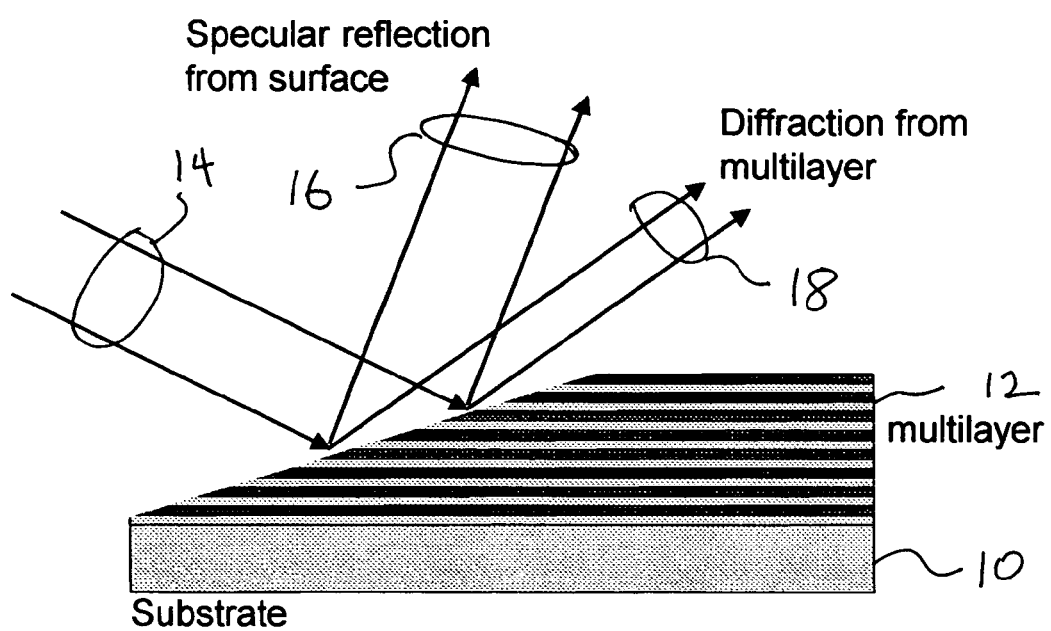
FIG. 1A shows that diffraction from an asymmetric-cut multilayer (or indeed any grating) leads to either a compression (as shown) or expansion of the width of the diffracted beam.

The invention provides an asymmetric-cut multilayer to diffract EUV light with the same properties as a perfect blazed grating. A highly efficient diffractive spectral purity filter, and a simple and inexpensive way to manufacture the filter onto a multilayer-coated optical element are described. The optical surface need not be tilted or redesigned. Cutting or polishing a multilayer coating at an angle relative to the surface gives rise to a volume diffraction grating that acts as a blazed grating with a blaze angle equal to the cut angle. In the case of the asymmetric-cut multilayer (also known as a sliced multilayer [V. E. Levashov and A. V. Vinogradov, Appl. Opt 32, 1130, 1993]), the condition for maximum multilayer reflection (the Bragg condition) is equivalent to the on-blaze condition. Only light that Bragg-diffracts from the multilayer structure (a volume effect that relies on interaction of the light with many layers in the structure) will be reflected. This light is specularly reflected from the Bragg layers, which are not parallel to the surface. FIG. 1A shows an embodiment of the invention using a substrate 10 upon which has been deposited a multilayer 12 cut at an angle. Light beam 14 is specularly reflected as beam 16 from the surface of the angularly cut portion of multilayer coating 12.

Figure 2A:
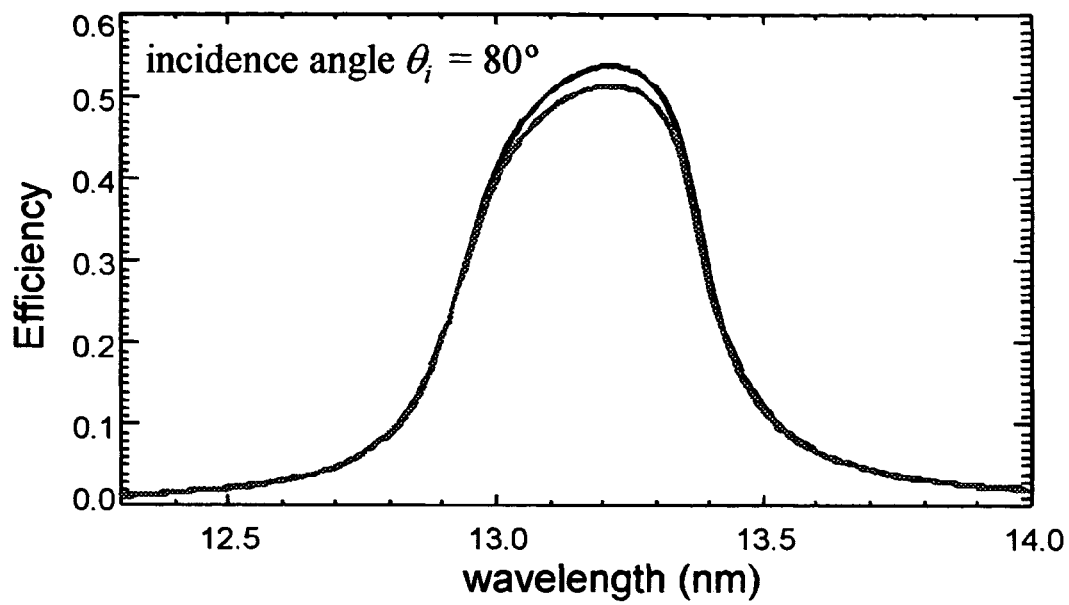
FIG. 2A shows measured efficiencies of an asymmetric cut multilayer, at EUV wavelengths.
Figure 2B:
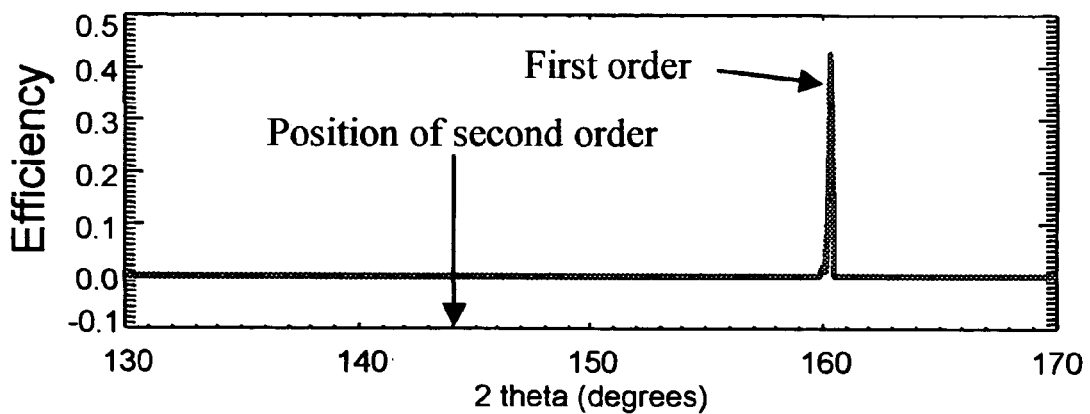
FIG. 2B shows that an asymmetric-cut multilayer does not exhibit any other diffracted order except for the first-order light that resonantly reflects from the layers.

The figure shows also that light 14 is diffracted from the multilayer 12 as beam 18. Non-specular reflections from the surface are either condensed or expanded. Conversion of phase space (Louiville's theorem) requires that the beam be dispersed in angle, an effect well known and utilized in asymmetric Bragg reflection from cut crystals [as described in standard texts, such as *Elements of Modern X-Ray Physics* by J. Als-Nielsen and D. McMorrow (Wiley, 2001)]. As has been demonstrated experimentally, an asymmetric-cut multilayer does not exhibit any other diffracted order except for the first-order light that resonantly reflects from the layers (see FIG. 2B). There is no specular EUV reflection or any higher orders and, as has been shown experimentally (FIG. 2A), the grating efficiency is almost as efficient as multilayer reflection. The small decrease in efficiency relative to the un-cut multilayer can be explained by oxidation of the exposed Mo layers. This can be prevented by capping the cut multilayer with a thin layer of silicon, or an oxidation-resistant material such as Ruthenium (see Bajt et al, "Improved reflectance and stability of Mo-Si multilayers," Opt Eng. 41, 1797–1804, 2002).

Figure 1B:
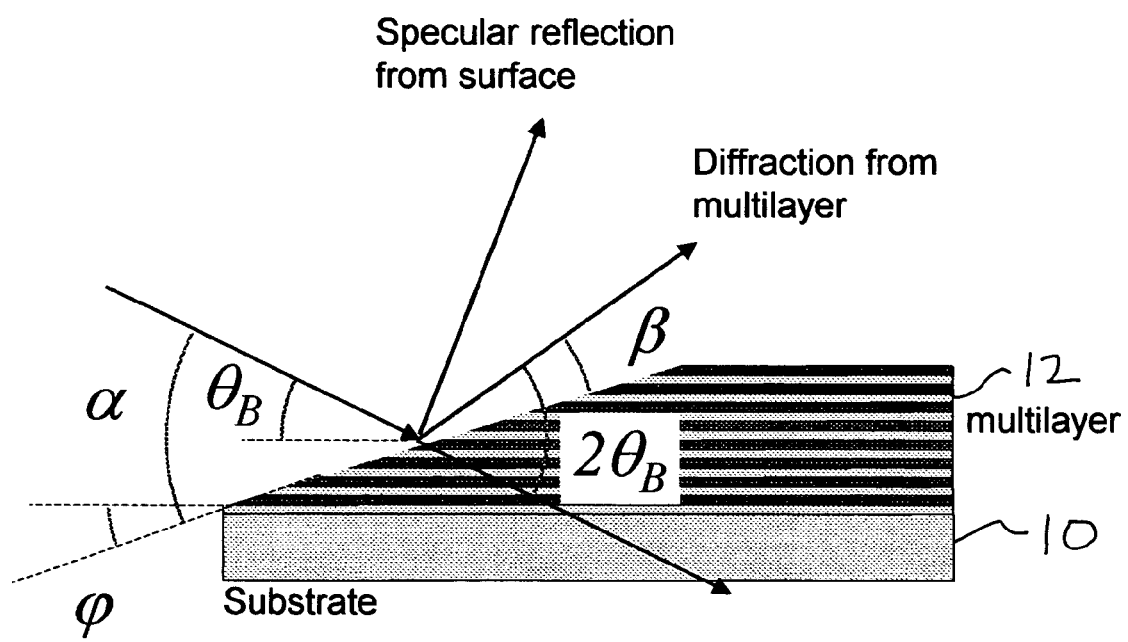
FIG. 1B shows a multilayer coated on a substrate, where the multilayer is cut or polished at an angle φ according to an embodiment of the present invention.

The diffracted light from the multilayer disperses, just as it does with a blazed grating. This means that the reflection angle of the in-band radiation varies slightly with wavelength. This can be considered as a chromatic aberration of the system. Referring to FIG. 1B, the dispersion is given by $$\frac{\partial \beta}{\partial \lambda} = -\frac{1}{\lambda}(1+b)\tan\theta_B$$

where $\beta$ is the exit angle, $\lambda$ is the wavelength, $\theta_B$ is the Bragg angle and $b=-\sin\alpha/\sin\beta$ is the asymmetry parameter, where $\alpha$ is the incident angle. The dispersion aberration should not cause a problem to the performance of the entire system, since this occurs in the illuminator system. However, the dispersion can reduced by using shallow cut angles for which a is almost equal to $\beta$, so that 1+b is small. In this case the specularly reflected visible and IR light will be close in angle to the diffracted EUV light. The unwanted visible and IR light can be blocked from propagating further in the system by using an aperture, as described in Sweatt, Tichenor, and Bernandez.

Figure 3:
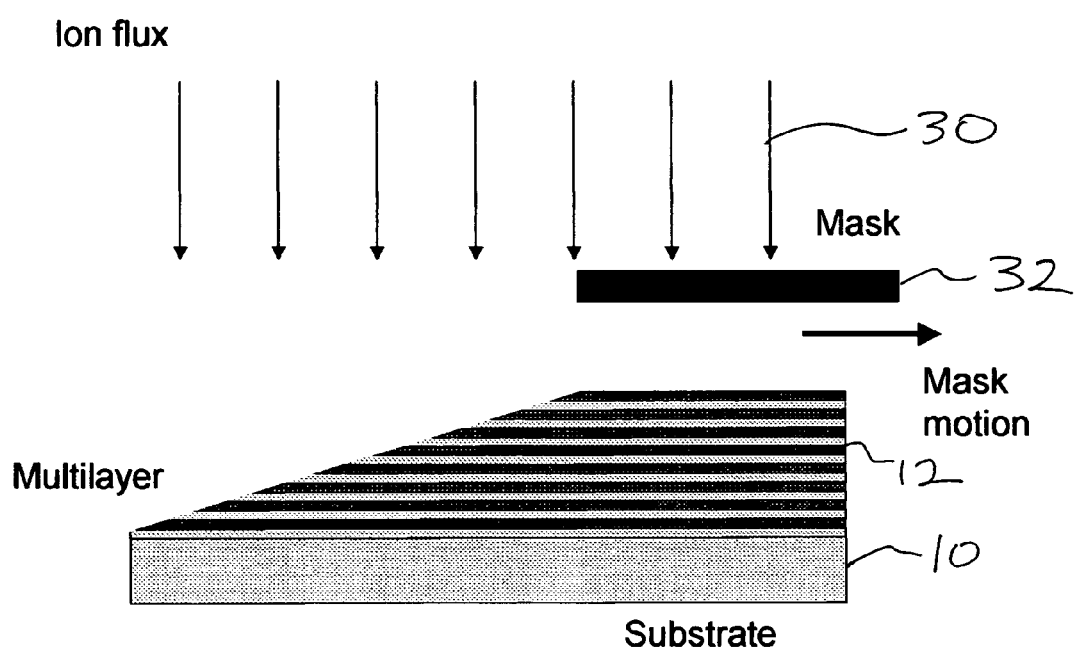
FIG. 3 illustrates a method for cutting the multilayer using ion-beam polishing.
Figures 4A, 4B:
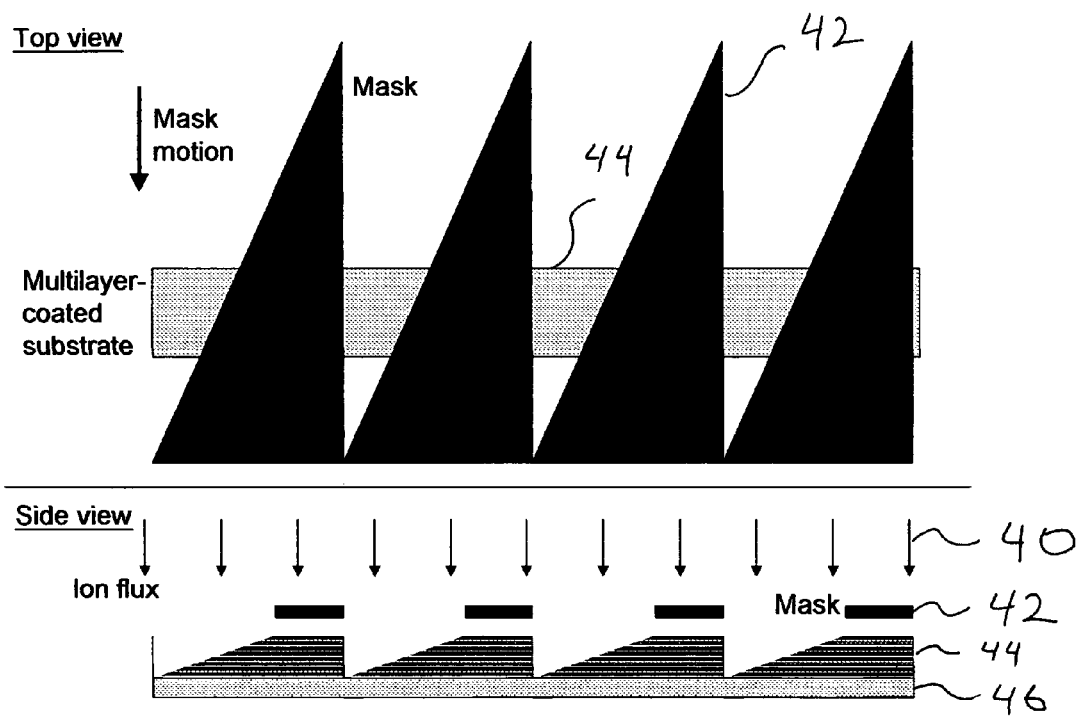
FIG. 4A is a top view illustrating a method for producing a large-area asymmetric cut multilayer.
FIG. 4B is a side view illustrating the method of producing a large-area asymmetric cut multilayer of FIG. 4A.

An asymmetric-cut multilayer can be made very simply by numerous polishing methods. Experimental tests of polishing with diamond paste were-very effective. FIG. 3 illustrates a more accurate method would be by ion-beam polishing or ion-beam milling wherein ion flux 30 is masked by a straight edge (mask) 32 that moves linearly with time. The method does require that the initial multilayer must have a large number of layers, so that a significant area of surface can be cut before reaching the bottom of the stack. For example, a multilayer of bilayer period of 6.9 nm, with 2500 bilayers, will have a total thickness of 17.25 micron. If cut at 0.5 degrees, to give an effective grating period of 800 nm, the exposed area will be 2 mm. Larger diffracting areas can be made very simply by repeating the cut across the surface of the multilayer. Referring to the top view of FIG. 4A and the side view of FIG. 4B, this can be done with ion-beam polishing, for example, by exposing an ion flux 40 through a moving notched mask 42, onto a multilayer 44 on substrate 46 (rather than using the single straight edge 32 of FIG. 3). Multilayers with 2500 bilayers have been made and are seen to be quite stable, of low stress, and of high quality (near-normal EUV reflectivity of 55% was measured). The reflectivity is lower than the 70% routinely achieved on thin (50 period) multilayers. It is expected that methods such as ion-beam assist deposition could produce near-perfect thick multilayers of 70% efficiency.

One embodiment of the invention, therefore, would be a curved optic that is already required in the illumination system of the EUV lithographic tool. The surface profile does not need to be reoptimized in any way. The optic is multilayer coated with a coating consisting of several thousand layers. A series of asymmetric cuts are made across the optic. The cuts could be made by the methods of ion-beam polishing discussed here and described in FIG. 4. Before exposing the cut multilayer to air, the cut would be capped with a material (or several materials) such as Ruthenium. In use, the in-band EUV light is specularly reflected from the multilayer planes. Out of band radiation that nevertheless reflects, such as visible and IR light, will be specularly reflected from the surface of the asymmetric-cut multilayer, and hence will be redirected out of the system. Note that unlike writing a blazed grating onto the optical surface, there is no need to reoptimize the optical design. Also, the in-band EUV light is reflected at the full efficiency of the multilayer reflection and there are no losses due to zero-order diffraction or higher-order diffraction.

The method described here to manufacture asymmetric-cut multilayers is novel and can also be applied to other uses. These include spectroscopy for: characterizing x-ray sources (such as plasmas) and for x-ray astronomy; pulse compression of chirped x-ray pulses from an x-ray free-electron laser (see presentation, "Compression of X-ray FEL Pulses with Volume Diffraction Elements," by H. N. Chapman et al UCRL-PRES-151222); and for EUV and x-ray monochromators for synchrotron beamlines.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

I claim:

1. A method for spectrally purifying light, comprising:
    providing a multilayer comprising at least 2 thousand periods, wherein said multilayer has been deposited onto a mirror substrate, wherein said multilayer is cut and polished at a cut angle to produce an asymmetrically cut surface such that desired EUV light having wavelengths only within a range from 11–14 nm directed onto said asymmetrically cut surface will be Bragg diffracted by said multilayer and undesired light having wavelengths only outside of said range will be absorbed in said multilayer or reflected by said asymmetrically cut surface;
    providing source light comprising a spectrum that includes said desired EUV light and said undesired light; and
    directing said source light onto said asymmetrically cut surface at an incidence angle such that only said EUV light Bragg-diffracts from said multilayer.

2. The method of claim 1, wherein said mirror substrate comprises a curvature.

3. The method of claim 1, wherein said asymmetrically cut surface is capped with an oxidation resistant material.

4. The method of claim 1, wherein dispersion is given by $$\frac{\partial \beta}{\partial \lambda} = -\frac{1}{\lambda}(1+b)\tan\theta_{B'}$$

where $\beta$ is the exit angle, $\lambda$ is the wavelength, $\theta_B$ is the Bragg angle and $b = -\sin\alpha/\sin\beta$ is the asymmetry parameter, and where $\alpha$ is the incident angle, wherein said cut angle is selected such that $\alpha$ is almost equal to $\beta$ to reduce dispersion of said EUV light after diffraction.

5. A method for making a dispersive grating, comprising:
    depositing a multilayer comprising at least 2 thousand periods onto a substrate; and
    cutting and polishing said multilayer at cut angle to produce an asymmetrically cut surface such that only desired light directed onto said asymmetrically cut surface will be Bragg diffracted by said multilayer and undesired light will be absorbed in said multilayer or reflected by said asymmetrically cut surface, wherein said desired light comprises EUV light having wavelengths only within a range from 11–14 nm, wherein said undesired light has wavelengths only outside of said range.

6. The method of claim 5, wherein said mirror substrate comprises a curvature.

7. The method of claim 5, wherein said asymmetrically cut surface is capped with an oxidation resistant material.

8. The method of claim 5, wherein dispersion is given by $$\frac{\partial \beta}{\partial \lambda} = -\frac{1}{\lambda}(1+b)\tan\theta_{B'}$$

where $\beta$ is the exit angle, $\lambda$ is the wavelength, $\theta_B$ is the Bragg angle and $b = -\sin\alpha/\sin\beta$ is the asymmetry parameter, and where $\alpha$ is the incident angle, wherein said cut angle is selected such that $\alpha$ is almost equal to $\beta$ to reduce dispersion of said EUV light after diffraction.

9. A diffractive spectral purity filter, comprising:
    a multilayer affixed to a substrate, wherein said multilayer comprises at least 2 thousand periods and is cut and polished at cut angle to produce an asymmetrically cut surface such that desired in-band light directed onto said asymmetrically cut surface will be Bragg diffracted by said multilayer and undesired out-of-band light directed onto said asymmetrically cut surface will be absorbed in said multilayer or reflected by said asymmetrically cut surface, wherein said desired light comprises EUV light having wavelengths only within a range from 11–14 nm, wherein said undesired light has wavelengths only outside of said range.

10. The diffractive spectral purity filter of claim 9, wherein said mirror substrate comprises a curvature.

11. The diffractive spectral purity filter of claim 9, wherein said asymmetrically cut surface is capped with an oxidation resistant material.

12. The diffractive spectral purity filter of claim 9, wherein dispersion is given by $$\frac{\partial \beta}{\partial \lambda} = -\frac{1}{\lambda}(1+b)\tan\theta_{B'}$$

where $\beta$ is the exit angle, $\lambda$ is the wavelength, $\theta_B$ is the Bragg angle and $b = -\sin\alpha/\sin\beta$ is the asymmetry parameter, and where $\alpha$ is the incident angle, wherein said cut angle is selected such that $\alpha$ is almost equal to $\beta$ to reduce dispersion of said EUV light after diffraction.

* * * * *